United States Patent [19]

Parks

[11] Patent Number: 4,841,355
[45] Date of Patent: Jun. 20, 1989

[54] THREE-DIMENSIONAL MICROELECTRONIC PACKAGE FOR SEMICONDUCTOR CHIPS

[75] Inventor: Howard L. Parks, Los Gatos, Calif.

[73] Assignee: Amdahl Corporation, Sunnyvale, Calif.

[21] Appl. No.: 154,852

[22] Filed: Feb. 10, 1988

[51] Int. Cl.[4] .................... H01L 23/46; H01L 23/36
[52] U.S. Cl. ............................................. 357/82; 357/81
[58] Field of Search .................... 357/81, 82, 79, 75; 361/382, 385; 165/80.4

[56] References Cited

U.S. PATENT DOCUMENTS 4,631,636 12/1986 Andrews .............................. 357/82
4,686,606 8/1987 Yamada et al. .................... 165/80.4
4,694,378 9/1987 Nakayama et al. ................. 361/385

FOREIGN PATENT DOCUMENTS 2813529 10/1979 Fed. Rep. of Germany ........ 357/81

Primary Examiner—Andrew J. James
Assistant Examiner—Sheila V. Clark
Attorney, Agent, or Firm—Fliesler, Dubb, Meyer & Lovejoy

[57] ABSTRACT

A three-dimensional microelectronic package for semiconductor chips includes a plurality of cavity wafers, each cavity wafer having a plurality of cavities and tunnels for providing coolant to the cavities, and a plurality of wafer packs provided between adjacent, stacked cavity wafers, each cavity wafer and wafer pack having conductive paths. Chip carriers for housing semiconductor chips are attached to portions of the wafer packs corresponding to the positions of the cavities in the cavity wafers. The chip carriers electrically interconnect the semiconductor chips with the connective paths of the wafer packs, and, through the wafer packs, the cavity wafers. The chip carriers also provide a medium for exchanging heat between the semiconductor chips and the coolant flowing to the cavities in the cavity wafers. Conductive paths provided in the cavity wafers electrically interconnect the various wafer packs. The application of pressure along the z-axis of the package creates liquid-tight seals between the chip carrier packages and the cavity wafers and establishes the electrical interconnections between the cavity wafers and the wafer packs.

27 Claims, 3 Drawing Sheets

THREE-DIMENSIONAL MICROELECTRONIC PACKAGE FOR SEMICONDUCTOR CHIPS

BACKGROUND OF THE INVENTION

1. Field Of The Invention

The present invention relates to packages (or microstacks) for mounting and interconnecting semiconductor chips; more particularly, to packages for housing high speed, high power semiconductor chips in a three-dimensional array, providing interconnections between the chips, and for dissipating the heat generated by the chips.

2. Description Of The Related Art

Many advances have been made in reducing the size of semiconductor devices, and thus in increasing the number of semiconductor devices on a chip. Accordingly, there has been an increase in the number of gates on each chip, in the number of leads (bonding pads) emanating from each chip, and in the electrical power handled by and heat created by each chip. These increases in densities have required increases in the number of connections between chips, and thus larger overall packages. As used herein, the term "chip(s)" refers to an encapsulated die having bonding pads provided thereon, and the term "package(s)" refers to devices for housing and/or interconnecting plural semiconductor chips. Dissipating the heat generated by semiconductor chips having large power handling capabilities has required larger packages.

Two different types of packages have been used to provide connections between the various chips in a package (or interconnect system), so-called "two-dimensional packages" and "three-dimensional packages." In a two-dimensional package individual leads connecting semiconductor chips provided on the exterior of the package pass in the x, y and z directions within the package. Such a package usually comprises a plurality of wafers provided in a stack with x and y interconnects on the surface of or contained in the wafers and z direction interconnections passing through the wafers.

In a three-dimensional package, semiconductor chips are mounted within the package; semiconductor chips may also be provided on the exterior of the package. Accordingly, a three-dimensional package may incorporate a larger number of semiconductor chips, requiring a larger number of interconnections and greater cooling capabilities. Moreover, the interconnect system becomes more complicated because of the limited areas where x, y and z direction connections can be provided.

To determine the relative capabilities of different packages or interconnect systems several standards are utilized. The most common standard for comparing the relative capabilities of interconnect systems is the number of interconnects per unit volume of package. A similar standard is the number of pins (or leads) per unit volume of package. Other methods of comparison include computing the package volume per chip and the number of gates per unit volume of package.

An example of a three-dimensional package is disclosed in U.S. Pat. No. 3,769,702, and an example of a two-dimensional package is illustrated in U.S. Pat. No. 3,705,332. Other U.S. Patents pertaining to packages for semiconductor chips include the following: U.S. Pat. No. 3,775,844; U.S. Pat. No. 3,813,773; U.S. Pat. No. 3,917,983; U.S. Pat. No. 4,095,867; U.S. Pat. No. 4,268,956; and U.S. Pat. No. 4,283,754.

The two and three-dimensional packages and interconnect systems illustrated in U.S. Pat. Nos. 3,705,332 and 3,769,702 utilize 50 mil. grids for the z-axis connections and have a pin density of approximately 940 pins per cubic inch.

Cooling the semiconductor chips sandwiched between wafers within a wafer stack becomes critical in three-dimensional packages. The factors to be considered in comparing the cooling needs and capabilities of various packages include the number of watts generated by each chip, the number of watts generated by the the total number of chips, the flow rate of coolant for each chip and for the package, and the thermal or temperature differential between the various semiconductor chips in the package. Prior liquid cooling systems often provide the same coolant to several chips serially. Thus, the coolant is warmed by each successive chip which it passes over and the ability of the coolant to dissipate heat diminishes for each successive chip. The last chip to receive the coolant will have a higher operating temperature than the first chip to receive the coolant. Such a temperature differential is detrimental to the operation of the overall system including the chips in question.

Other problems with prior packages are the large size and weight of the packages and the computers incorporating such packages. Conventional CPU weights approach 0.6 pounds per LSI chip.

SUMMARY OF THE INVENTION

It is, therefore, an object of the present invention to provide a three-dimensional package for semiconductor chips providing an increased interconnection density and enhanced chip cooling capabilities.

A further object of the present invention is to provide a three-dimensional package which provides private coolant to each semiconductor chip in the package.

Another object of the present invention is to provide a three-dimensional package which avoids temperature gradients between the various semiconductor chips.

Another object of the present invention is to provide a three-dimensional package having a reduced volume and weight per chip.

Another object of the present invention is to provide a three-dimensional package which allows for disassembly and reassembly of the wafers comprising the package, including engineering change wafers, to allow the computer to be upgraded very rapidly and at a low cost.

The present invention relates to a three-dimensional microelectronic package for semiconductor chips including a plurality of cavity wafers, each cavity wafer having a plurality of cavities and tunnels for providing coolant to the cavities, and a plurality of wafer packs provided between adjacent, stacked cavity wafers, each cavity wafer and wafer pack having conductive paths. A plurality of chip carries for housing semiconductor chips, are attached to portions of the wafer packs corresponding to the positions of the cavities in the cavity wafers and the chip carries electrically interconnect the semiconductor chips with the conductive paths of the wafer packs, and provide a medium for exchanging heat between the semiconductor chips and the coolant flowing to the cavities of the cavity wafers. The vias (or conductive paths) provided in the cavity wafers electrically interconnect the conductive paths of the wafer packs on opposing sides of the cavity wafers. The application of pressure along the z-axis of the package creates liquid-tight seals between the chip carrier packages and the cavity wafers and the electrical interconnections between the cavity wafers and the wafer packs.

Each wafer pack may comprise button connect wafers and x-y interconnect wafers provided between successive button connect wafers. The wafer packs may be disassembled to provide different x-y interconnect wafer between successive button connect wafers, thereby changing the electrical interconnections provided by the wafer pack. Pressure is applied along the z-axis of the package to establish connections between the button connect wafers and the x-y interconnect wafers in the wafer packs, and between the wafer packs and the cavity wafers.

The tunnels in the cavity wafers provide each cavity with its own supply of coolant, so-called "private water" or "private coolant." By providing private water to each semiconductor chip, the present invention achieves a temperature differential of approximately 5° C. or less for all chips in the package; present embodiments of the package of the subject invention house approximately 140-ȝchips. The cooling capability of the three-dimensional package of the present invention is 5,000 watts at a flow rate of 1.5 gallons per minute for the system or 0.01 gallons per minute per chip. In each case, a vast improvement over prior packaging technology.

A three-dimensional package in accordance with the present invention has a volume of approximately 21 in$^3$ (344 cm$^3$). Such a three-dimensional package would house 140-150 chips having on the order of 1.4 million gates. Thus, the package of the present invention has approximately 2,468 pins/in$^3$ (150 pins/cm$^3$) and the volume per chip is approximately 0.1 in$^3$ (1.56 cm$^3$) per chip.

The advances in the material technology used to fabricate the cavity wafers provides the ability to utilize a 20 mil. grid, thereby increasing the interconnect density (and correspondingly the pin density) by a factor of 2.5 over prior packages.

DESCRIPTION OF THE PREFERRED EMBODIMENT

A three-dimensional microelectronic package for semiconductor chips in accordance with a preferred embodiment of the present invention will be described with reference to FIGS. 1–7.

Figure 1:
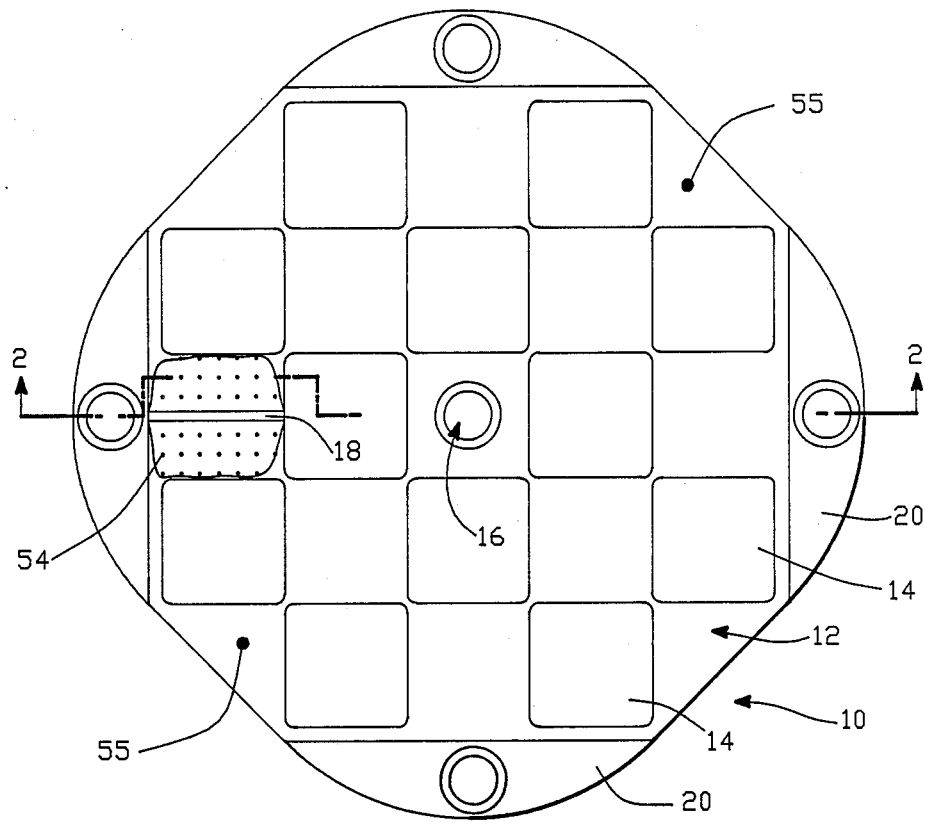
FIG. 1 is a top view of a three-dimensional microelectronic package for semiconductor chips according to the present invention.
Figure 2:
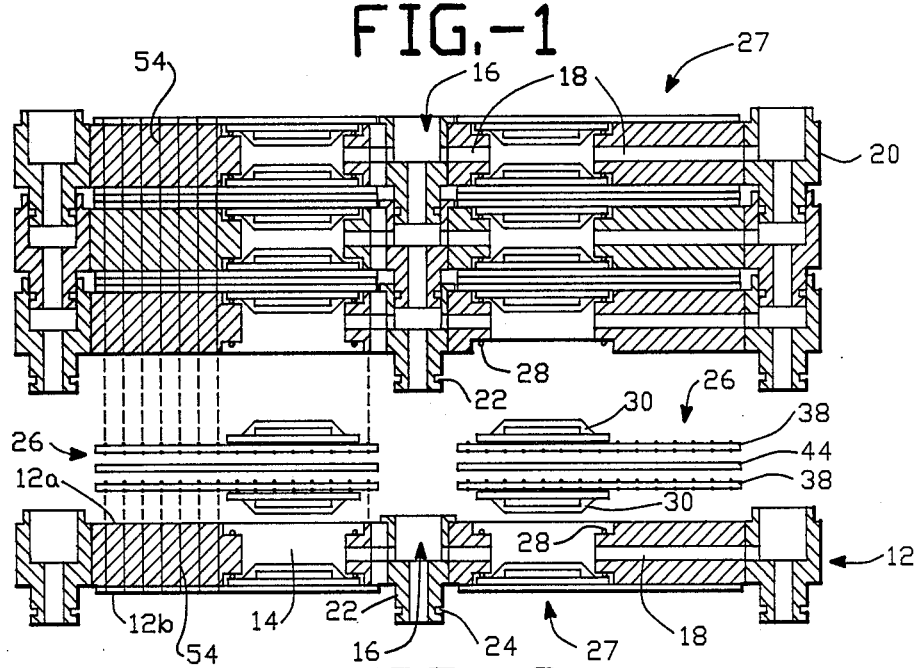
FIG. 2 is a cross-sectional view of a three-dimensional microelectronic package taken along line A—A' of FIG. 1.

With reference to FIGS. 1 and 2, a three-dimensional microelectronic package 10 according to the present invention includes a plurality of cavity wafers 12 provided in a stack; a top view of the stack is provided in FIG. 1 and a cross-sectional view along line A—A' of FIG. 1 is shown in FIG. 2. Each cavity wafer 12 has a plurality of cavities 14, a coolant inlet 16, and tunnels 18 for supplying coolant from the coolant inlet 16 to the cavities 14.

Figure 3:
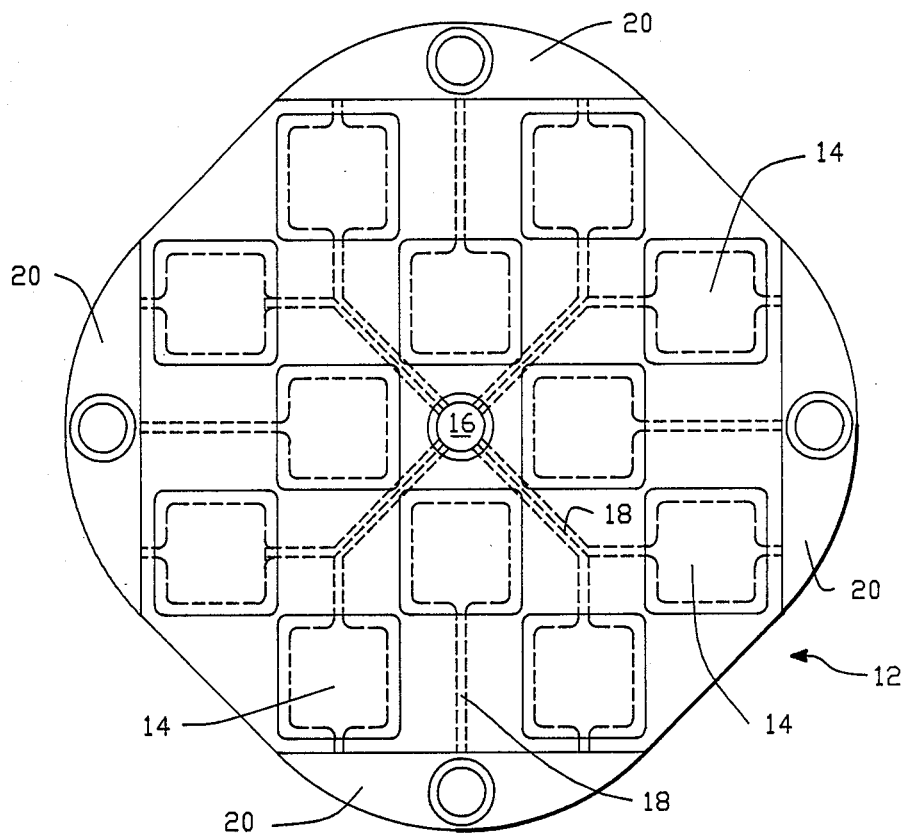
FIG. 3 is a plan view of a cavity wafer illustrating the tunnels for providing coolant to the cavities.

In the preferred embodiment the number of tunnels 18 extending from the coolant inlet 16 to the cavities 14 is equal to the number of cavities 14; the layout of tunnels is shown in FIG. 3. Private coolant is supplied from the coolant inlet 16 to each cavity 14 by the tunnels 18 associated with respective ones of the cavities 14, thus providing lower system thermal differentials between chips than if a serial coolant feed system was utilized. The tunnels 18 also serve to exhaust the coolant from the cavities 14 to plenums 20 provided at the periphery of the package 12.

Coolant is provided to the tunnels 18 in each cavity wafer 12 by a plurality of coolant inlet segments 22 which, when mated together, form a coolant inlet pipe. Each coolant inlet segment 22 has a male and a female end, and the male end of each coolant inlet segment 22 has a groove (or indentation) 24 where an O-ring (not shown) is provided. When the coolant inlet segments 22 are mated together, as shown in the cross-sectional view of FIG. 2, the O-ring (not shown) in groove 24 provides a seal between adjacent coolant inlet segments 22.

The coolant inlet segments 22 are preferably formed of metal, whereas the cavity wafers 12 are formed of ceramic. To join the coolant inlet segments 22 to the cavity wafers 12, the ceramic cavity wafers 12 are metallized with a refractory metal and the coolant inlet segments 22 are brazed to the metallized portion of the cavity wafers 12. The metallization is provided by plating the cavity wafer 12 with a copper/nickel/gold alloy. Various other alloys of copper and gold, as well as combinations thereof, are contemplated for us in metallizing or plating the cavity wafers 12 so that inlet segments 22 can be soldered or brazed to the cavity wafers 12. Plenums 20 are also preferably formed of metal and attached to the edges of the cavity wafers 12 in a similar manner.

Cavities 14 extend between the top and bottom surfaces 12a, 12b of each cavity wafer 12. A seal 28 is provided between each chip carrier 30 and a respective cavity wafer 12, and opposing pairs of chip carrier 30 provide liquid-tight cooling spaces in cavities 14.

A wafer pack 26, 27 provides electrical interconnections between chip carriers 30 attached to the same wafer pack 26, 27 and to cavity wafers 14. The wafer packs 26, 27 support, interconnect and provide the force necessary to create a seal between the chip carries 30 and cavity wafers 14. Each cavity 14 is sealed by "O-ring" seal 28 and chip carrier 30. Two chip carriers 30 are resident in each cavity 14. A pair of opposed chip carriers 30 in sealed relationship with a cavity wafer 12 are shown in the cross-sectional view of FIG. 4.

Figure 4:
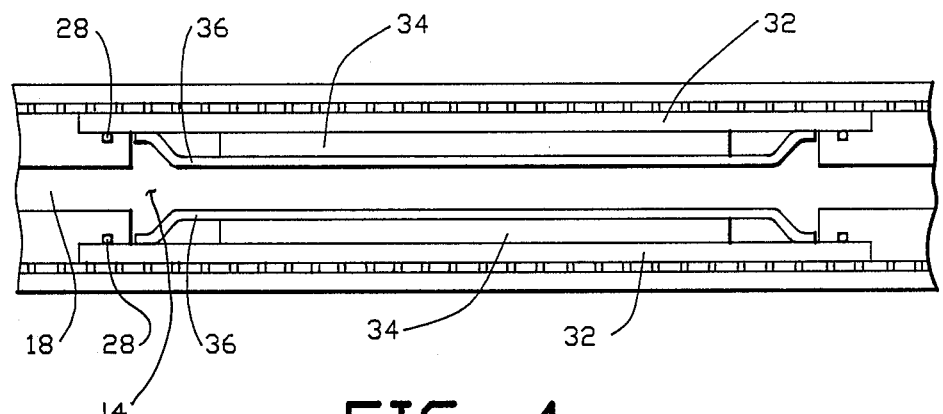
FIG. 4 is a cross-sectional view of a cavity and chip carriers situated back-to-back in the cavity.

As shown in FIG. 4, each chip carrier 30 includes a chip connector wafer 32 on which a semiconductor chip 34 is mounted and a sealing cap 36 forming a liquid-tight seal with chip carrier wafer 32 in order to maintain the semiconductor chip 34 in a liquid-free environment. Whether the coolant selected is a gas or liquid, the seal should maintain an "air-tight" environment for the semiconductor chip 34. The sealing cap 36 may be formed of a metal or other highly thermally conductive material and is preferably attached directly to the back of the semiconductor chip 34 and in direct contact with the coolant in the cavity 14, thereby providing efficient semiconductor chip power dissipation. The power dissipation provided by this arrangement is on the order of 10-'watts per chip for chips having an area of 10-12 square millimeters.

Figure 6:
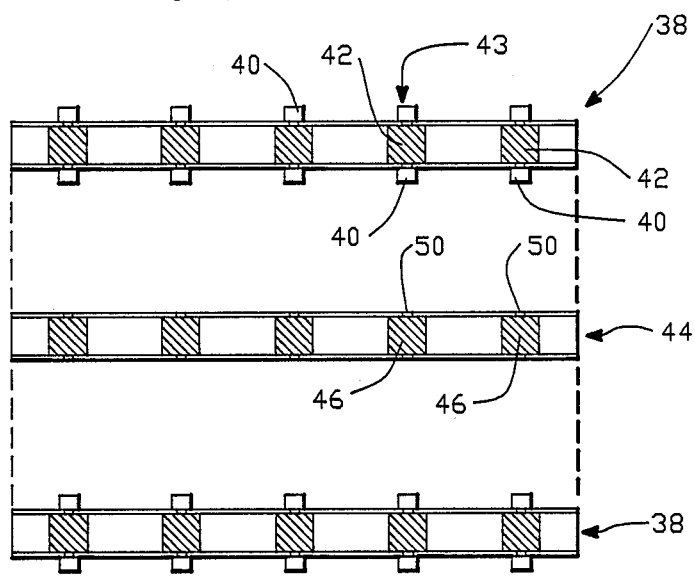
FIG. 6 is an exploded view of a wafer pack including two button connect wafers and an x-y interconnect wafer.
Figure 5:
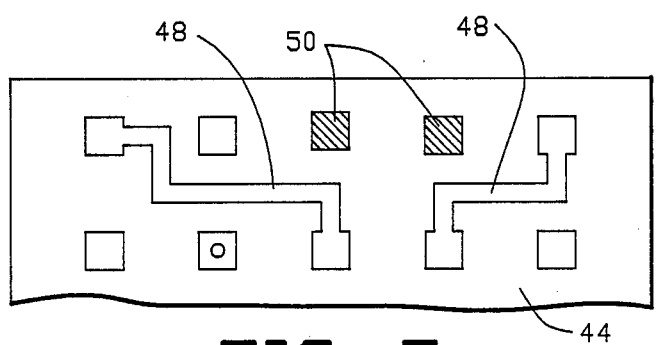
FIG. 5 is a partial plan view of an x-y interconnect wafer.

The electrical interconnections between individual semiconductor chips 34 and to electronic devices external to the package 10 will be described with reference to FIGS. 2, 4, 5, and 6. Such interconnections are provided in large part by wafer packs 26, 27 and chip carriers 30 which may collectively be referred to as interconnect means. Alternate wafers in wafers pack 26, 27 are button connect wafers 38 having buttons (or raised inter-wafer contacts) 40 provided in a matrix array on both sides of the button connect wafer 38. Buttons 40 on opposed sides of the button connect wafer 38 are electrically connected by button connect wafer vias 42 (FIG. 6). Each pair of opposed buttons 40 and the corresponding via 42 are referred to as a segment 43. In the preferred embodiment of the present invention the segments 43 are on 20 mil. centers.

X-y interconnect wafers 44 interposed between or adjacent to connect wafers 38 have vias 46 in a matrix corresponding to the matrix of buttons 40 on a button connect wafers 38. X-y interconnect wafers 44 also have wiring patterns 48 in the plane of the wafers which provide electrical interconnections between various vias 48.

The cross-sectional view in FIG. 2 illustrates a wafer pack 26 having two button connect wafers 38 with a single x-y interconnect wafer 44 interposed between the button connect wafers 38. However, in practice a wafer pack 26 may include many layers of alternating button connect wafers 38 and x-y interconnect wafers 44 with the matrices of x-y interconnect wafer vias 46 and segments 43 providing columns of interconnects perpendicular to the wafers in a wafer pack 26. The columns of interconnects extend through the wafers in a wafer pack 26 to provide z-axis signal routing except where interruptors or insulators 50 are provided at the surface of an x-y interconnect wafer via 48. The x-y interconnect wafers 44 provide the routing of signals in the x-y plane via wirings 48 to form a three-dimensional electrical interconnect system in each wafer pack 26. Single wafer packs 27 are similar in structure to double wafer packs 26; however, since only a single chip carrier 30 is provided on a single wafer pack 27, the use of button connect wafers 38 and x-y interconnect wafers 44 is adjusted accordingly. Various structures and methods of fabricating are known for wafers such as button connect wafers 36 and x-y interconnect wafers 44 as well as buttons 40, vias 42, vias 46, and interrupts 50 as disclosed in, for example, U.S. Pat. Nos. 3,705,332, 3,775,844, 3,769,706, 4,095,867, and 4,283,754.

Each chip carrier wafer 32 has a semiconductor chip 34 mounted on one side thereof and a matrix of I/O pads 52 on the other surface thereof. I/O pads 52 are aligned with buttons 40 on button connect wafers 38.

Referring again to FIG. 2, electrical connections between various wafer packs 26 are provided by cavity wafer vias 54 provided in regions of the chip carrier wafers 12 surrounding cavities 14 and tunnels 18. To achieve the via density necessary for a matrix of vias having 20 mil. centers, the cavity wafers 12 are formed of a plurality of thin ceramic laminates ("green sheets") which are laser drilled. The laser drilled holes are filled with a conductive paste comprising a refractory metal. The laminates are aligned and stacked and then fired at a temperature of approximately 1500° C. The firing cures the laminates, integrating the laminates into a single wafer, and causes the conductive paste in each series of aligned holes to flow and then harden into a segment which provides a via. The cavity wafers 12 are approximately 0.5 millimeters thick after firing.

To provide a signal path through the columns of segments 43 and vias 46 in wafer packs 26, buttons 50 formed of a malleable metal material which deforms to provide a relatively wide contact area with vias 46 when the package 10, and thus wafer packs 26, are placed under pressure. To prevent adjacent button connect wafers 38 and x-y interconnect wafers 44 from moving laterally with respect to each other. Alignment rods 55 (FIG. 1) may be provided through the entire stack to align cavity wafers 14 and wafer packs 26, 27.

Figure 7:
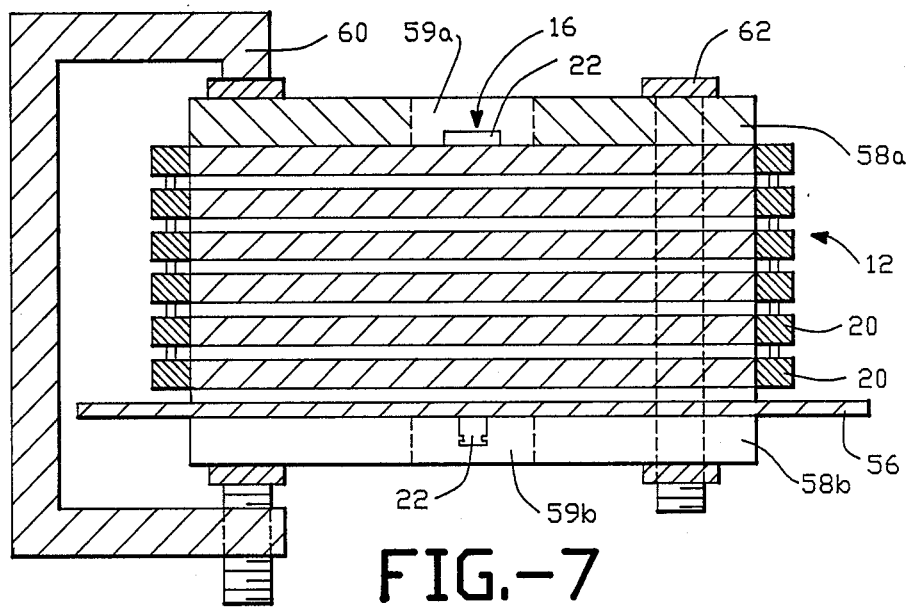
FIG. 7 is a cross-sectional view of a three-dimensional microelectronic package for describing the system for pressurizing the package.

With reference to FIG. 7, an I/O wafer board 56 having buttons (not shown) similar to buttons 40 on button connect wafers 38 as well as wirings (not shown) similar to wirings 46 on x-y interconnect wafers 44 are utilized to provide connections from the package to external electronic components.

The package 10 is pressurized by placing pressure plates 58a and 58b at the top and bottom of the package and providing pressure to force the two pressure plates 58a, 58b towards one another. Pressure plates 58a, 58b each have an opening 59a, 59a for the coolant inlet pipe. The pressure on the pressure plates 58A, 58B can be provided by external means such as clamps 60 or by internal means such as bolts 62 passing through the package. The use of bolts 62 is favored because bolts 62 provide a more even distribution of pressure than clamps, and thus thinner pressure plates 58A, B may be utilized. Alternatively, an external pressurizing means may be incorporated in a support structure (not shown) which also provides coolant and electrical connections to the package 10.

Pressurizing the package 10 serves to provide electrical connections between buttons 40 on button connect wafers and x-y interconnect wafer vias 48, between I/O pads 52 of chip carrier wafers 32 and cavity wafer vias 54 between buttons 40 and cavity wafer vias 54 and between button connect wafers 38 and I/O wafer boards 56. The pressurization of the stack also provides the liquid seals between adjacent mating coolant inlet segments 22, and between the chip carriers 30 and the cavity wafers 12 through seals 28.

The overall dimensions of a three-dimensional package 10 according to the present invention are approximately 100-by-100-by-36 millimeters and are capable of housing, interconnecting, and cooling approximately 140–150 semiconductor chips 34 having on the order of 1.4 million gates. The total volume of 225 cubic centimeters of the package 10 relates to approximately 1.56 cubic centimeters per chip. Utilizing a 20 mil. grid the package 10 incorporates approximately 52,000 leads having a density of approximately 2500 pins per cubic inch. The package 10 is capable of dissipating approximately 5,000 watts.

The many features and advantages of the three-dimensional package of the present invention will be apparent to those skilled in the art from the description of the preferred embodiment. Thus, the following claims are intended to cover all modifications and equivalents falling within the scope of the invention.

What is claimed is:

1. A three-dimensional microelectronic package for semiconductor chips, comprising:
   a plurality of cavity wafers, each cavity wafer having a plurality of cavities, tunnels for providing private coolant to said cavities, and conductive paths, said cavity wafers being arranged in a stack;
   a plurality of interconnect means, attached to said cavity wafers at positions corresponding to the positions of the cavities, for housing the semiconductor chips, electrically interconnecting the semiconductor chips and said conductive paths of said cavity wafers, selectively electrically interconnecting said conductive paths of adjacent cavity wafers, and for providing a medium for exchanging heat between the semiconductor chips and the coolant in the cavities.

2. A three-dimensional microelectronic package according to claim 1, wherein each said tunnel provides private coolant to and removes coolant from a respective one of said cavities.

3. A three-dimensional microelectronic package according to claim 2, further comprising a plurality of coolant inlet segments corresponding to and interconnected with the tunnels of respective ones of said cavity wafers, each said coolant inlet segment mating with the coolant inlet segments of the adjacent cavity wafers.

4. A three-dimensional microelectronic package according to claim 3, further comprising a plurality of plenums interconnected to the tunnels of each said cavity wafer to exhaust the coolant from the tunnels.

5. A three-dimensional microelectronic package according to claim 4, wherein:
   each said interconnect means comprises a wafer pack and a chip carrier;
   each wafer pack comprises a stack of wafers having a matrix of conductive columns in the z direction and wirings in the plane of the wafers providing interconnections between said columns; and
   each said chip carrier interconnects a chip with the conductive columns in a respective wafer pack.

6. A three-dimensional microelectronic package according to claim 5, further comprising means for applying pressure to said package to provide electrical contracts between said conductive columns of said wafer packs and said cavity wafers, and to provide seals between said chip carriers and said cavity wafers.

7. A three-dimensional microelectronic package for semiconductor chips, comprising:
   a plurality of cavity wafers, each cavity wafer having a plurality of cavities and tunnels for providing private coolant to said cavities, said cavity wafers being arranged in a stack;
   a plurality of wafer packs provided between adjacent ones of said cavity wafers, each wafer pack having conductive paths for selectively electrically interconnecting said conductive paths of adjacent cavity wafers; and
   a plurality of chip carriers attached to portions of said wafer packs corresponding to the positions of the cavities, for housing the semiconductor chips, selectively electrically interconnecting the semiconductor chips and said conductive paths of said wafer packs, and for contacting the coolant in the cavities to provide a medium for exchanging heat between the semiconductor chips and the coolant.

8. A three-dimensional microelectronic package according to claim 8, wherein each said tunnel provides private coolant to and removes coolant from a respective one of said cavities.

9. A three-dimensional microelectronic package according to claim 8, further comprising a plurality of coolant inlet segments corresponding to and interconnected with the tunnels of respective ones of said cavity wafers, each said coolant inlet segment mating with the coolant inlet segments of the adjacent cavity wafers.

10. A three-dimensional microelectronic package according to claim 9, further comprising a plurality of plenums interconnected to the tunnels of each said cavity wafer to exhaust the coolant from the tunnels.

11. A three-dimensional microelectronic package according to claim 7, wherein said conductive paths in said cavity wafers comprise vias electrically interconnected with said conductive paths of said wafer packs adjacent to respective cavity wafers.

12. A three-dimensional microelectronic package according to claim 11, wherein each said wafer pack comprises a stack of wafers having a matrix of conductive columns in the z direction and wirings in the plane of the wafers providing interconnections between said columns.

13. A three-dimensional microelectronic package according to claim 12, wherein:
   said wafers in each said wafer pack include a button connector wafer for each chip carrier associated with the wafer pack and at least one x-y interconnect wafer; and
   said chip carriers are attached to said button connect wafers.

14. A three-dimensional microelectronic package according to claim 13, wherein:
   said chip carriers have connector pads;
   said button connect wafers have connector buttons; and
   said connector pads are electrically connected to said connector buttons.

15. A three-dimensional microelectronic package according to claim 7, wherein each said chip carrier comprises:
   a chip support, on which the semiconductor chip is mounted, having connector pads; and
   a sealing cap surrounding the semiconductor chip, attached to the chip support, and thermally coupled to the semiconductor chip.

16. A three-dimensional microelectronic package according to claim 7, further comprising sealing means for providing a seal between each said chip carrier package and the associated cavity wafer.

17. A three-dimensional microelectronic package according to claim 16, further comprising means for applying pressure to said microelectronic package to provide the electrical interconnections between said cavity wafers and said wafer packs and between said button connector wafers and said x-y interconnect wafers.

18. A three-dimensional microelectronic package according to claim 7, wherein each said cavity wafer comprises a plurality of thin laminates, said thin laminates each having overlapping matrices of vias.

19. A three-dimensional microelectronic package according to claim 18, wherein:
   said conductive paths of said wafer packs include a plurality of conductive columns arranged in a matrix; and said matrices of vias in said cavity wafers are interconnected with said matrices of columns in said wafer packs.

20. A three-dimensional microelectronic package according to claim 7, further comprising an input/output wafer means for providing electrical interconnection connections with the package.

21. A three-dimensional microelectronic package according to claim 20, wherein said input/output wafer means provides electrical power to and data and control signals to and from said semiconductor chips via said conductive paths in said cavity wafers and wafer packs.

22. A three-dimensional microelectronic package for semiconductor chips, comprising:
a plurality of cavity wafers, each cavity wafer having a top and a bottom surface, a plurality of cavities having openings and said top and bottom surfaces of said cavity wafer, a plurality of tunnels for providing coolant to respective ones of said cavities, and a plurality of interconnects terminating at the top and bottom surfaces of the cavity wafer, said cavity wafers being arranged in a stack;
a plurality of wafer packs provided between adjacent ones of said cavity wafers, each wafer pack having conductive paths, a portion of said conductive paths being interconnected with the interconnects of adjacent cavity wafers;
a plurality of chip carriers for housing the semiconductor chips, electrically interconnecting the semiconductor chips and a portion of said conductive paths of said wafer packs, and for providing a medium for exchanging heat between the semiconductor chips and the coolant in the cavities, the chip carriers being attached to portions of said wafer packs corresponding to the positions of the cavities and being in contact with the coolant;
sealing means for providing a seal between each said chip carrier package and the associated cavity wafer; and
means for applying pressure to said microelectronic package to provide the electrical interconnections between said cavity wafers and said wafer packs and for activating said sealing means.

23. A three-dimensional microelectronic package according to claim 22, wherein each said wafer pack comprises a stack of wafers having a matrix of conductive columns in the z direction and wirings in the plane of the wafers providing interconnections between said columns.

24. A three-dimensional microelectronic package according to claim 23, wherein:
said wafers in each said wafer pack include plural button connect wafers and x-y interconnect wafers provided between adjacent button connect wafers; and
said chip carriers are attached to said button connect wafers.

25. A three-dimensional microelectronic package according to claim 24, wherein:
said chip carriers have connector pads;
said button connect wafers have connector buttons; and
said connector pads are electrically connected to said connector buttons.

26. A three-dimensional microelectronic package according to claim 25, wherein each said chip carrier comprises:
a chip support on which the semiconductor chip is mounted and the connector pads are provided; and
a sealing cap surrounding the semiconductor chip, attached to the chip support, and thermally coupled to the semiconductor chip.

27. A three-dimensional microelectronic package according to claim 7, further comprising sealing means for providing a seal between each said chip carrier and the associated cavity wafer.

* * * * *